United States Patent [19]

Prentice

[11] Patent Number: 5,030,862
[45] Date of Patent: Jul. 9, 1991

[54] TURN-OFF CIRCUIT FOR GATE TURN OFF SCR

[75] Inventor: John S. Prentice, Palm Bay, Fla.

[73] Assignee: Harris Corporation, Melbourne, Fla.

[21] Appl. No.: 474,417

[22] Filed: Jan. 31, 1990

[51] Int. Cl.[5] ............................................. H03K 17/72
[52] U.S. Cl. .................................... 307/633; 307/305; 307/634; 307/637
[58] Field of Search ................. 307/633, 634, 637, 305

[56] References Cited

U.S. PATENT DOCUMENTS

| | | | |
|---|---|---|---|
| 3,638,042 | 1/1972 | Studtmann | 307/637 |
| 4,626,703 | 12/1986 | Patalong et al. | 307/637 |
| 4,821,083 | 4/1989 | Ogura et al. | 307/637 |
| 4,833,587 | 5/1989 | Sugayama et al. | 307/633 |
| 4,866,315 | 9/1989 | Ogura et al. | 307/633 |

Primary Examiner—John Zazworsky

Attorney, Agent, or Firm—Evenson, Wands, Edwards, Lenahan & McKeown

[57] ABSTRACT

Turn-off of a GTO-SCR with substantially reduced tail current is achieved by means of a controlled switching circuit coupled to the both the anode gate and the cathode gate of the thyristor. When operated, the switching circuit simultaneously removes current from the cathode gate and injects current into the anode gate, thereby completely removing stored charge. The controlled switching circuit preferably comprises a transistor the collector-emitter path of which bridges the anode and the anode gate of the GTO SCR, and injects anode gate current at the same time that current is being removed from the cathode gate. Control of the base drive to the bridging transistor may be effected by a current mirror drive circuit referenced to the cathode gate of a turn-off control thyristor.

6 Claims, 1 Drawing Sheet

TURN-OFF CIRCUIT FOR GATE TURN OFF SCR

FIELD OF THE INVENTION

The present invention relates in general to thyristor control circuits and is particularly directed to a current mirror-driven switch circuit for effecting dual gate turn-off of a GTO silicon controlled rectifier.

BACKGROUND OF THE INVENTION

Silicon controlled rectifiers (SCRs) are used extensively for controlled (regulated) AC-DC power supply applications. Where current flow in the circuit is to be controllably interrupted, a (PNPN) gate turn-off (GTO) type SCR is often used. One such application, in which a GTO SCR is used to controllably gate or switch the current flow path between a diode-rectified AC input source and a storage capacitor in accordance with whether or not the line voltage exceeds the capacitor voltage, is described in U.S. Pat. No. 4,675,798, to S. R. Jost et al, entitled "Direct Coupled Switching Power Supply With GTO SCR Switching Element", assigned to the assignee of the present application and the disclosure of which is incorporated herein.

In such circuits, in order to turn off the GTO-SCR device, and thereby interrupt the flow of current in the circuit path to which the anode and cathode of the SCR are coupled, it has been customary practice to controllably remove current from its cathode gate. For a detailed discussion of GTO-SCR operation, attention may be directed to various texts on the subject, such as that entitled "Semiconductor Power Devices", by S. Ghandi, Chapter 5, pp. 190–261, published by Wiley & Sons.

As discussed in an article entitled One-Dimensional Analysis of Turnoff Phenomena for a Gate Turnoff Thyristor", IEEE Transactions on Electron Devices, Volume ED-26, No. 3, Mar. 1979, pp. 226–231, the turn-off sequence of a GTO-SCR may be characterized by three successive periods of time — storage time, fall time and tail time. The current which flows during the latter period (tail current) is a result of PNP transistor action (for cathode gate turn-off), when charge (electrons), stored in the base of the PNP transistor portion of the thyristor, is forced by the collector-base junction capacitance displacement current across the base-emitter junction. Tail current can cause device failures if its magnitude is large enough to cause substantial power dissipation, which tends to be localized at 'hot spots', leading to melting of the device, as explained in an article (source unidentifiable) entitled "The Current Status of the Power Gate Turn-Off Switch GTO", by M. Okamura et al, pp. 39–49, circa 1977–1978.

Unfortunately, proposed techniques to reduce tail current have typically involved an increase in processing complexity in the design and manufacture of the SCR, specifically by incorporating into the SCR device structure some mechanism for decreasing the PNP transistor current gain, for example by the introduction of carrier killers (via gold doping, irradiation), or the use of anode shorts (i.e. built-in resistors or diodes in parallel with the emitter-base junction). Moreover, because such modifications of the structure of the SCR bias its operation in favor of turn-off, they tend to negatively impact on-state characteristics of the device.

SUMMARY OF THE INVENTION

In accordance with the present invention, the above-mentioned drawbacks of conventional mechanisms to control turnoff of a GTO-SCR device are obviated by means of a controlled switching circuit, which is coupled to both the anode gate and the cathode gate of the thyristor and serves to not only remove current from the cathode gate, as does a conventional turn-off device, but also injects current into the anode gate, so that electrons stored in the anode gate region are caused to preferentially leave by way of the anode gate contact (to which current is being applied). This action keeps the anode from injecting holes back into the anode gate region, thereby effectively eliminating the source of the tail current and the potential localized failure of the SCR. (It should be noted that the present invention addresses the turning-off of a GTO SCR and, in particular, a mechanism for substantially reducing the above-discussed tail current problem, which is not to be confused with applications where multiple gate control has been used for turning on an SCR, such as described in an article entitled: "Complementary Gated MOS Thyristor for Dielectrically Isolated High Voltage ICs" by S. Murakami et al, Electrochemical Society Meeting, May 1989, p 451.)

Pursuant to a preferred embodiment of the present invention, the controlled switching circuit comprises a first controlled switching device which, when operated, controllably couples a first current source to the anode gate of the thyristor, and a second controlled switching device which, when operated, controllably couples a second current source (sink) to the cathode gate of the thyristor. The controlled switching circuit simultaneously operates the first and second controlled switching devices, so that, as current is being removed from the cathode gate, current is also being injected into the anode gate, thereby completely removing stored charge.

When incorporated as part of a controlled power supply, the GTO-SCR control circuit of the present invention may employ a switching device (e.g. transistor) which is controlled so that its current flow path bridges the anode and the anode gate, and thereby effects an injection of anode gate current, at the same time that current is being removed from the cathode gate. Control of the base drive to a transistor employed as such a switching device may be effected by a current mirror drive circuit of the type described in my copending patent application, Ser. No. 474,172 entitled "Current Mirror Circuit", filed on even date herewith, assigned to the assignee of the present application and the disclosure of which is incorporated herein.

In accordance with that invention, control of the current mirror output current, particularly a reduction in the output-to-input current ratio (e.g. to a value less than unity), which has the benefit of reducing power dissipated in the current mirror output transistor, is achieved by the addition of a second transistor in the base-emitter drive path of a current mirror output transistor and referencing the base drive of the second transistor to the same diode junction as the current mirror output transistor. This cascoding of plural transistors effectively decreases the base-emitter voltage of the output transistor by the collector-emitter voltage of the second transistor, which normally operates at saturation. As a consequence, as the base-emitter drive voltage is incrementally reduced, the output (collector)

current of the mirror output transistor can be reduced by multiples of an order of magnitude of that obtained without the incorporation of the additional transistor. Because, in the SCR GTO turn-off control circuit, the voltage drop across the mirror output transistor generally follows that of the GTO SCR (which, at turn-off, can be expected to be on the order of several hundred volts), such a reduction in output current serves to substantially reduce the power dissipated by the current mirror output transistor.

For providing precision control of the turn-off source and sink current to the GTO-SCR circuit described above, the diode junction to which the current mirror transistors' base drive is referenced may be that of the cathode gate of another thyristor, which is used to controllably switch the current mirror off and on while, at the same time, controlling the removal of current from the cathode gate of the GTO-SCR. The current mirror output is coupled to the base electrode of an anode gate current injection transistor, the emitter-collector path of which is coupled across the anode and the anode gate of the GTO-SCR. By controlling the base drive to the anode gate current injection transistor with the same control device (the second SCR) which controls the removal of current from the cathode gate of the GTO-SCR, a very precise turn-off of the GTO-SCR and thereby precision operation of the controlled power supply circuit may be achieved.

DETAILED DESCRIPTION

Figure 1:
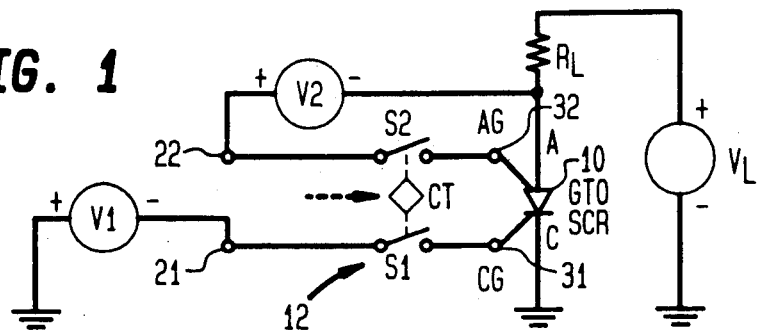
FIG. 1 is a general schematic diagram of a controlled switching circuit for effecting turnoff of a GTO-SCR device in accordance with the present invention.

Referring to FIG. 1, a general schematic diagram of a controlled switching circuit for effecting turnoff of a GTO-SCR device 10 is shown as comprising a four port controlled switching element 12, diagrammatically depicted as a double pole single throw switch, having first and second input terminals 21, 22 and first and second output terminals 31, 32 which are controllably bridged by first and second switch contacts S1 and S2, respectively. In practice, controlled switching element 12 may be comprised of bipolar transistors, thyristors, MOSFETS, JFETS, or a combination of such devices. Moreover, in a practical implementation, switching element 12 may be comprised of first and second switching devices which, when operated to turn-off device 10, conductively bridge its anode to its anode gate, on the one hand, and its cathode to its cathode gate, on the other hand. Thus, the first switching device of switching element 12 may comprise a first transistor, such as a bipolar transistor, first and second current flow path (emitter-collector) electrodes of which are coupled to the anode and the anode gate, so that application of a turn-off signal to its control electrode (base) will effectively conductively bridge the anode and the anode gate. Similarly, the second switching device of switching element 12 may comprise a second transistor, such as a bipolar transistor, the collector and emitter electrodes of which are coupled to bridge the cathode gate and cathode of the thyristor, whereby application of a turn-off signal to its base will cause the cathode and cathode gate of the thyristor to be conductively interconnected via the emitter-collector path of the second transistor.

Output terminal 31 is coupled to the cathode gate CG of thyristor 10 and output terminal 32 is coupled to its anode gate AG. The anode A and cathode K of thyristor 10 are respectively coupled to high (+) and low (e.g ground return) voltage terminals and across a load resistor $R_L$ and a load supply $V_L$. Coupled to input terminals 21, 22 are first and second auxiliary voltage sources V1 and V2 for optionally boosting or increasing the currents to be respectively removed from cathode gate CG and injected into anode gate AG, when the contacts of switching element 12 are closed.

In operation, the (externally controlled) closure of contacts S1 and S2 of switch 12 will simultaneously couple cathode gate CG to a current removal sink (e.g. ground potential or, with auxiliary source V1 coupled as shown, to a negative voltage V1) and anode gate AG to a current injection source (anode A or, with auxiliary source V2 coupled as shown, to a positive voltage source V2), thereby effecting a complete removal of stored charge. Once the stored charge has been removed, thyristor 10 is completely turned off, and there is no longer any anode or cathode current, nor is there any current through switch 12, even with contacts S1 and S2 closed. Electrons that were stored in the anode gate region have been removed by the injection of anode gate current, which keeps the anode from injecting holes back into the anode gate region, thereby effectively eliminating the source of the tail current.

As pointed out previously, one practical application of the SCR turn-off control circuit of the present invention is as part of a regulated AC-DC power supply, such as that described in the above-referenced Jost et al patent, in which a GTO SCR is used to controllably gate or switch the current flow path between a diode-rectified AC input source and a storage capacitor, depending upon whether or not the line voltage exceeds the capacitor voltage.

Pursuant to a preferred embodiment of a turn-off control circuit for such an application, switching element 12 is comprised of a first switching device (in the form of an anode gate/anode bridging transistor) and a second switching device (in the form of a second thyristor coupled to the cathode gate), which are actuated simultaneously to carry out the above-described stored charge removal. Moreover, the base drive to the anode gate/anode bridging transistor is derived by way of an improved current mirror circuit of the type described in my previously referenced copending patent application, the base drive for the mirror transistors of which referenced to the second thyristor. As a consequence, operation of the second thyristor governs simultaneous removal of current from the cathode gate (through the anode-cathode path of the second thyristor) and injection of current to the anode gate of the GTO SCR (through the current mirror output to the bridging transistor).

Figure 2:
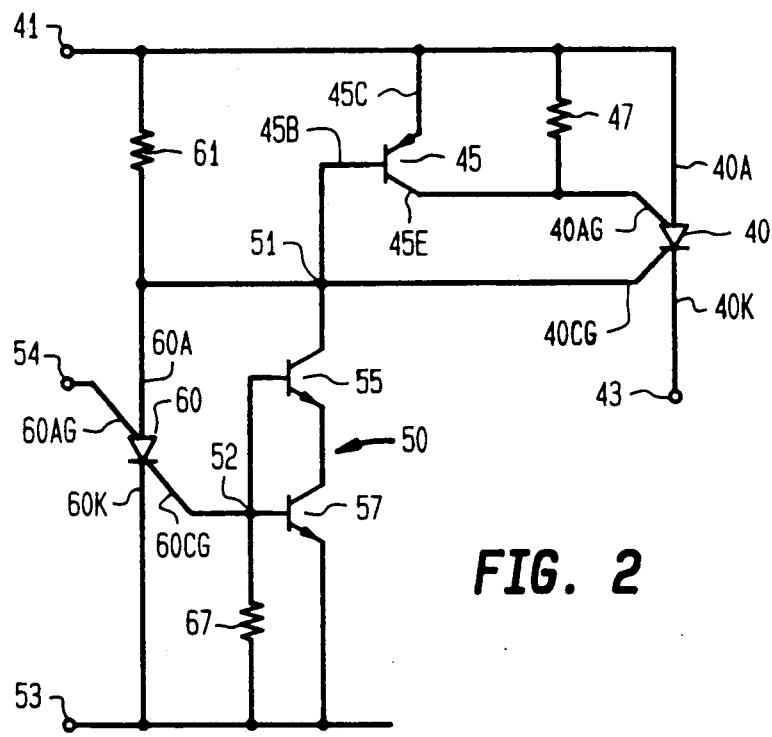
FIG. 2 schematically illustrates an embodiment of the present invention.

Such a preferred embodiment is schematically illustrated in FIG. 2, which shows a GTO SCR 40, the anode 40A and cathode 40K of which are coupled in a voltage supply path between a positive rectified AC voltage input terminal 41 and a voltage output terminal 43 (which may be considered to be analogous to terminals (3) and (5), respectively, in the regulated power supply schematic diagram of FIG. 2 of the Jost et al patent). For negative voltage applications, the cathode of the SCR would be coupled to a negative rectified AC voltage terminal.

In accordance with the improved turn-off control circuit of the present invention, the above-discussed injection of current into the anode gate 40AG of thyristor 40 is effected by way of a PNP transistor 45, the emitter 45E of which is connected to anode 40A and the collector 45C of which is connected to the anode gate 40AG of thyristor 40. A resistor 47, which is connected across anode gate 40AG and anode 40A, serves to remove leakage current from thyristor 40 to prevent false triggering (due to leakage current). The base 45B of PNP transistor 45 is coupled to a current output terminal 51 of a current mirror circuit 50, so that the base drive current to transistor 45 can be precisely established at the value required for saturation operation (current injection to anode gate 40AG). In effect transistor 45 performs the function of contact S2 in the schematic illustration of FIG. 1, described above.

Current mirror circuit 50 further includes a current input terminal 52 which is coupled to the base of each of a pair of NPN output current transistors 55 and 57, the collector-emitter current paths of which are coupled in series between output terminal 51 and a reference terminal 53 (e.g. the AC return). The bases of transistors 55 and 57 are connected to the rectifying junction of a cathode gate 60G of a second thyristor 60, the anode 60A of which is coupled through resistor 61 to voltage input terminal 41 to the cathode gate 40CG of GTO SCR 40. The cathode 60K of SCR 60 is coupled to reference terminal 53. The anode gate 60AG of thyristor 60 is coupled to a control terminal 54. Although shown as a single emitter device in FIG. 2, transistor 57 may have a multi-emitter configuration, with one emitter coupled to the base, as described in my previously referenced copending application. A resistor 67 is coupled between reference terminal 53 and the base of each of transistors 55 and 57. Similar to resistor 47, referenced previously, resistor 67 serves to remove leakage current that might cause false triggering of the thyristor 60.

In operation, let it be initially assumed that GTO SCR is conductive or ON and SCR 60 and transistors 45, 55 and 57 are OFF. In order to initiate a turn-off of SCR 40, a negative-going signal is applied to control terminal 54 and, thereby, to the anode gate 60AG of thyristor 60, turning on thyristor 60. When SCR 60 conducts, the cathode gate 40CG of thyristor 40 becomes reverse biased relative to its cathode 40K, so that current is removed from its cathode gate 40CG. As pointed out previously, and as described in the above-referenced literature, this removal of current from its cathode gate is sufficient to turn GTO SCR off. However, the problem of tail current remains.

In accordance with the present invention, this problem is addressed by turning on current injection transistor 45. For this purpose, when SCR 60 is turned on, the change in voltage at its cathode gate 60CG simultaneously biases transistors 55 and 57 ON, so that output terminal 52, and therefore the base of transistor 45, now sees a mirror output current which drives transistor 45 into saturation. With its emitter-collector path now optimally conductive, electrons stored in the anode gate region of GTO SCR 40 now are rapidly depleted via the anode gate contact. As a consequence, anode 40A is prevented from injecting holes back into the anode gate region, thereby effectively eliminating the source of the potentially damaging tail current. With transistor 45 driven into saturation, the base-emitter junction of the PNP transistor portion of thyristor 40 is effectively shorted out, reducing its current gain to considerably less than one (e.g. on the order of 0.1–0.01).

As noted previously, one of the advantages of using the current mirror drive circuit described in my copending application is the fact that it has an output-to-input current ratio of less than one, so that mirror output transistor is able to operate at reduced current levels (on the order of 100 microamps) in the presence of the substantial off voltage of GTO SCR 40 (e.g. several hundred to five hundred volts), whereby the power dissipated in transistor 55 is reduced to an acceptable level.

Figure 3:
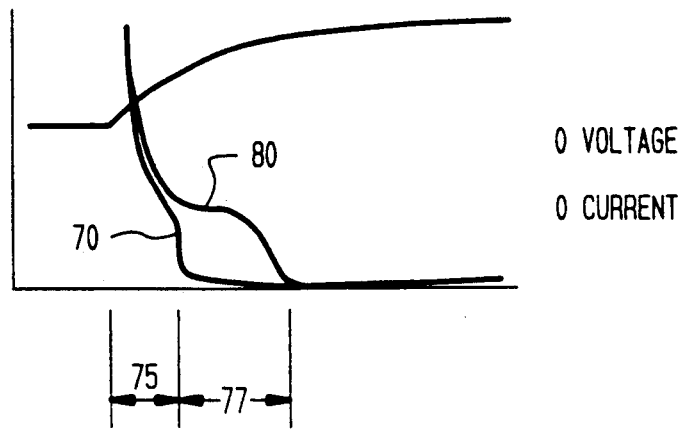
FIG. 3 shows a graphical comparison of the tail current characteristic of a GTO-SCR operated by the control circuit in accordance with the present invention and that without both cathode and anode gate current control.

FIG. 3 shows a graphical comparison of the tail current characteristic of a GTO-SCR operated by the control circuit of FIG. 2 and that without the dual cathode and anode gate current control functionality of the present invention. In particular, the characteristic of FIG. 3 is associated with an input voltage of 100 V/div, and input current of 20 ma/div, a turn-off time of 5 microseconds/ div and an operation at 208 volts AC. The value of the peak on-current prior to turn-off was approximately 2 amps. As can be seen from FIG. 3, the tail current trace 70 associated with a GTO-SCR that is turned off by the control mechanism of the present invention drops rapidly to zero over a five microsecond interval 75, whereas during a subsequent interval 77, the tail current behavior 80 of a GTO-SCR using a conventional cathode gate only turn-off mechanism still has a substantial magnitude, which may lead to localized failure, as discussed above.

As will be appreciated from the foregoing description of the GTO-SCR turnoff control circuit of the present invention, by augmenting a conventional cathode gate turn-off mechanism with a switching circuit that also injects current into the anode gate of the SCR, whereby electrons stored in the anode gate region are caused to preferentially leave by way of the anode gate contact, the anode is prevented from injecting holes back into the anode gate region, thereby effectively eliminating the source of the tail current. In addition, by driving the anode gate current injection transistor with a current mirror capable of supplying an output current which may be only a fraction (less than an order of magnitude) of its input current, the power dissipated by the drive circuit can be substantially reduced.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A current mirror-driven control circuit comprising:
   a voltage input terminal;
   a current output terminal;
   a reference terminal;
   a control terminal;
   an output terminal;
   a first silicon controlled rectifier having a first anode, a first cathode, a first anode gate and a first cathode gate, said first anode being coupled to said voltage input terminal, said first cathode being coupled to said reference terminal and said first anode gate being coupled to said control terminal;

first and second transistors having their collector-emitter current flow paths coupled in series between said current output terminal and said reference terminal, and having their base electrodes coupled to said first cathode gate;

a second silicon controlled rectifier having a second anode, a second cathode, a second anode gate and a second cathode gate, said second anode being coupled to said voltage input terminal, said second cathode being coupled to said output terminal, and said second cathode gate being coupled to said first anode; and a switching device having an input electrode coupled to said second anode, an output electrode coupled to said second anode gate, and a control electrode coupled to said current output terminal.

2. A current mirror-driven control circuit according to claim 1, wherein said switching device comprises a third transistor, respective emitter, collector and base electrodes of which correspond to said input, output and control electrodes.

3. A current mirror-driven control circuit according to claim 1, wherein said second transistor has a plurality of emitters one of which is coupled to its base and another of which is coupled to said reference terminal.

4. A current mirror-driven control circuit for controllably turning off a gate turn-off thyristor provided in the supply path of a regulated AC-DC power supply circuit comprising:

a voltage input terminal coupled to receive a rectified AC voltage;

a voltage output terminal;

a current output terminal;

a reference terminal coupled to the AC return path of said power supply circuit;

a control terminal to which a turn-off signal is coupled;

a first silicon controlled rectifier having a first anode, a first cathode, a first anode gate and a first cathode gate, said first anode being coupled to said voltage input terminal, said first cathode being coupled to said reference terminal and said first anode gate being coupled to said control terminal;

first and second transistors having their collector-emitter current flow paths coupled in series between said current output terminal and said reference terminal, and having their base electrodes coupled to the first cathode gate of said first silicon controlled rectifier;

a second silicon controlled rectifier having a second anode, a second cathode, a second anode gate and a second cathode gate, said second anode being coupled to said voltage input terminal, said second cathode being coupled to said voltage output terminal, and said second cathode gate being coupled to the first anode of said first silicon controlled rectifier; and a switching device having an input electrode coupled to the second anode of said second silicon controlled rectifier, an output electrode coupled to the second anode gate of said second silicon controlled rectifier, and a control electrode coupled to said current output terminal.

5. A current mirror-driven control circuit according to claim 4, wherein said switching device comprises a third transistor, respective emitter, collector and base electrodes of which correspond to said input, output and control electrodes.

6. A current mirror-driven control circuit according to claim 4, wherein said second transitor has a plurality of emitters one of which is coupled to its base and another of which is coupled to said reference terminal.

* * * * *